(12) United States Patent
Mattis (10) Patent No.: US 7,045,811 B2
(45) Date of Patent: May 16, 2006

(54) SIGNAL AMPLIFICATION USING ARCHITECTURES OF NANODOTS AND CONNECTING CHANNELS

(75) Inventor: Daniel C. Mattis, Salt Lake City, UT (US)

(73) Assignee: The University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 10/737,178

(22) Filed: Dec. 16, 2003

(65) Prior Publication Data

US 2004/0155235 A1 Aug. 12, 2004

Related U.S. Application Data

(60) Provisional application No. 60/433,738, filed on Dec. 16, 2002.

(51) Int. Cl.
*H01L 29/12* (2006.01)
(52) U.S. Cl. .................. 257/15; 257/E29.071; 438/962
(58) Field of Classification Search .................. 257/15, 257/E29.071; 438/962
See application file for complete search history.

(56) References Cited

U.S. PATENT DOCUMENTS

| | | | |
|---|---|---|---|
| 5,347,140 A * | 9/1994 | Hirai et al. .................... | 257/17 |
| 6,459,095 B1 | 10/2002 | Heath et al. | |
| 6,489,041 B1 * | 12/2002 | Tamura et al. .............. | 428/620 |

OTHER PUBLICATIONS

J. Goldstone and R.L. Jaffe, *Bound States in Twisting Tubes*, Physical Review B, vol. 45, No. 24, pp. 100-107 (1992).
Th. Maier, et al, *d-Wave Superconductivity in the Hubbard Model*, Physical Review Letters, vol. 85, No. 7, pp. 1524-1527 (2000).
D.C. Mattis, *Eigenvalues and Magnetism of Electrons on an Artificial Molecule*, International Journal of Nanoscience, vol. 2, No. 3, pp. 165-170 (Jun. 2003).
Heng Yu et al., *Two-Versus Three-Dimensional Quantum Confinement in Indium Phosphide Wires and Dots*, Nature Materials, vol. 2 (Aug. 2003).
U.S. Appl. No. 11/122,948, filed May 5, 2005, Mattis.

(Continued)

*Primary Examiner*—Anh Duy Mai
(74) *Attorney, Agent, or Firm*—Workman-Nydegger (57) ABSTRACT

Particle localization by geometrical nanostructures allows for the fabrication of artificial atoms and molecules suitable for use as building blocks for molecular electronic devices. Artificial lattices made from the artificial atoms and molecules can be used to create artificial networks or arrays. These can be formed by depositing strips of homogeneous semiconductor material on an insulator substrate and etching away unwanted material to form specific lattice shapes, such as by using photolithographic methods or other techniques. The artificial atoms and molecules can be used to form field effect transistors, power and signal amplifiers, artificial electrical conductors, and artificial two-dimensional electronic superconductors. The artificial molecules of the invention can also be employed in constant magnetic fields and probed by electromagnetic fields to produce magnetic memory elements.

24 Claims, 5 Drawing Sheets

OTHER PUBLICATIONS

Tatiana I. Makarova, et al., Magnetic carbon, Letters to Nature, vol. 413, Oct. 18, 2001, pp. 716-718.

New Directions with Fewer Dimensions, Physics Web, Oct. 2002, http://www.physicsweb.org/articles/world/15/10/9/1.

S. A. Trugman, Interaction of Holes in a Hubbard Antiferromagnet and High-Temperature Superconductivity, Physical Review B, vol. 37, No. 4, Feb. 1, 1988, pp. 1597-1603.

Elliot Lieb and Daniel Mattis, Ordering Energy Levels of Interacting Spin Systems, Journal of Mathematical Physics, vol. 3, No. 3, Jul.-Aug. 1962, pp. 749-751.

Daniel C. Mattis, The Theory of Magnetism II, Springer-Verlag, NY Berlin 1985, pp. 69-72.

Elliott H. Lieb, Physical Review Letters, Two Theorems on the Hubbard Model, vol. 62, No. 10, 1989, pp. 1201-1204.

* cited by examiner

SIGNAL AMPLIFICATION USING ARCHITECTURES OF NANODOTS AND CONNECTING CHANNELS

This application claims the benefit of priority to U.S. Provisional Application No. 60/433,738, filed on Dec. 16, 2002, the disclosure of which is herein incorporated by reference.

BACKGROUND OF THE INVENTION

1. Field of the Invention

The present invention relates to techniques for particle localization by geometrical structures. More specifically, the invention relates to methods and devices for particle localization in geometrically ordered nanostructures and the fabrication of large arrays of artificial atoms and molecules having electronic properties suitable to signal amplification, electrical conductivity, anti-ferromagnetism, and the like.

2. Relevant Technology

Nanotechnology is rapidly evolving field. The race is on to develop self-organizing structures that can be used as active circuit elements. For example, U.S. Pat. No. 6,459,095 B1 discloses a process that traps electrically switchable molecules between crossed wires only a few atoms wide, allowing for the creation of a manufacturable molecular electronic technology. There is also currently a great deal of interest in quantum dots, which are three-dimensional heterostructures measuring about 1 nm ($10^{-9}$ m) to about 100 nm in each direction, in which electrons, holes and/or excitons may be confined.

Superconductivity, a low temperature phenomenon (T<25 K) that is found in some "bad" metals (Pb, Sn, Hg, Nb, etc.) and their alloys, was discovered a century ago. A fundamental theory was lacking until 1957 when Bardeen (also co-inventor of the transistor), and his students Cooper and Schrieffer developed the Bardeen-Cooper-Schrieffer (BCS) electron-pairing theory that is at the heart of our present-day understanding. In 1986, Berdnoz and Müller found the first "high-temperature superconductor" (HTS), capable of superconductivity at temperatures some 50% higher than the previous best and believed by many researchers to be ultimately capable of exceeding room temperature (20° C.) in future developments. The pairing is the same but the mechanism that causes pairing appears to be novel. Unlike "low" temperature superconductors, the HTS have been found to-date only in the layered $CuO_2$ planes that can occur in crystals of the perovskite type. When each $CuO_2$ unit contains precisely 5 active electrons, the collective behavior is that of a single spin ½. Each $CuO_2$ plane resembles a spin ½ Heisenberg antiferromagnet, weakly coupled from plane to plane. Even such weak coupling allows for a Néel temperature of up to 1000 K, indicating that the in-plane coupling parameter J is substantial. When electrons are taken away, say a fraction f is removed (f is typically in the range of 5%–25%,) a fraction f of the $CuO_2$ units will acquire spin 0 and a charge +e relative to the other units. This missing electron is called a hole. The presence of holes allows metallic conductivity and superconductivity in $CuO_2$.

Experimentally the BCS energy gap is not isotropic across the Fermi surface in HTS as it is in the low-temperature superconductors, but has nodes corresponding to so-called "d-waves." The study of many-body systems (e.g., Hubbard model, t-J models) has indicated that holes promote electronic conductivity and superconductivity, that HTS is mediated by the same antiferromagnetic forces measured by J as the antiferromagnet, and that the gap should have d-wave symmetry. However, there is complete disagreement and confusion in the physics community regarding the precise mechanism and the exact model parameters that apply.

Computer simulations of the Hubbard and t-J models have failed to be definitive, owing to the difficulty of solving the many-fermion problem on a sufficiently large lattice—even approximately.

Memory elements are traditionally dichotomic—such as spin "up" or "down." In giant magnetoresistance (GMR,) a current is modulated by whether two magnetic fields applied to two nearby conducting elements are parallel or antiparallel. But this set-up is difficult to miniaturize, as the power expended in electrical currents can quickly exceed the ability of the material to dissipate and causes meltdown when circuit elements are densely packed.

Microdots have been made out of specially designed semiconductors embedded in a host material. They trap from 1 to 100 electrons, or valence band holes, or combinations of both called "excitons."

Field effect transistors (FET) are commonly used for weak-signal amplification, d-c switching or signal generation. In a MOSFET (metal-oxide semiconductor FET), the conductivity of a channel is affected by transverse voltage applied at a gate. This metallic gate, acting across a metal-oxide insulating layer, capacitatively charges the channel, thus affecting its conductivity. The gate in the MOSFET has a high input impedance, therefore low input power. The modulation of the channel width by the gate voltage can be large, therefore there is a large output current and power gain inherent in such devices. If the oxide layer is very thin the electrical fields are high and the density of carriers could be changed capacitatively, further optimizing the amplification. But thin dielectrics are fragile, breaking down at or less than $10^6$ v/cm. This limits the ability to modulate charge density by capacitative structures in conventional MOSFETs.

SUMMARY OF THE INVENTION

The present invention relates to techniques for particle localization by geometrical nanostructures, which allow for the fabrication of artificial atoms and molecules suitable for use as building blocks for molecular electronic devices. When the artificial molecules made in this fashion involve a sufficiently large number of artificial atoms, such as a few dozen or more, these are called "arrays" or "networks." The connectivity of artificial atoms in such artificial molecules and arrays is their "architecture." The artificial atoms, molecules and arrays can be formed by depositing strips of homogeneous semiconductor material (using photolithographic methods or other techniques), having a nanometer scale size and exhibiting at least one node (a crossing of two or more strips) on an insulator substrate material, and if necessary, etching away unwanted material to form specific desirable lattice shapes. Each node is configured to localize from about 1 to about 2 subatomic particles, with the particles being confined to the nodes or, to a lesser extent, to the strips.

The artificial molecules and arrays can be used to form field effect transistors, amplifiers, electrical conductors, artificial ferromagnets or antiferromagnets, and artificial two-dimensional electronic superconductors by, for example, sandwiching the active semiconductor layer between insulating layers and metal overlayers, as in MOSFETS. Additionally, artificial molecules of the invention can be employed to produce magnetic memory elements.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE INVENTION

The present invention uses a recently discovered property of particles in narrow spaces (see e.g., J. Goldstone and R. L. Jaffe, *Bound States in Twisting Tubes*, Physical Review B45, 14, 100 (1992), which is incorporated herein by reference), as the building block in a new concept for the creation of synthetic structures to make artificial atoms and molecules. The terms "particle" or "particles" used herein refers to subatomic particles and related particles such as electrons, photons, excitons, phonons, and the like.

The present invention applies techniques for particle localization by geometrical nanostructures that allow for the production of artificial atoms, and from them, small or large molecules and arrays suitable for use in electronic devices. While the present invention uses procedures based on currently available technologies, it will be understood that the concepts described herein could be applied to technologies developed in the future.

In general, the low-energy motion of particles down a narrow channel becomes one-dimensional if the channel length (L) is much greater than (>>) the channel width (a). In such a regime, a particle can be localized (i.e., made zero-dimensional) at any enlargements (e.g., bends or nodes) of the channel. The binding energy is a geometrically determined fraction of the transverse kinetic energy, and there are no other parameters. This purely geometric effect has the potential to help create new types of quantum dots such as nanodots and artificial lattices.

The artificial lattices made from artificial atoms and molecules can be used to create artificial networks. These can be formed by depositing strips (channels) and nodes (circles or bubbles) of homogeneous semiconductor material on an insulator substrate, and etching away unwanted material to form specific lattice shapes as illustrated in the figures, such as by using photolithographic methods or other techniques.

In addition, artificial electrical conductors can be formed principally in two dimensions, with the sheet resistance controlled by an external, capacitative gate, and artificial two-dimensional electronic superconductors can also be formed. Field effect transistors and signal- or power-amplifiers based on the preceding may also be produced.

The artificial molecules of the invention can be employed as magnetic memories, with the potential of reading and writing using appropriate, low-energy electromagnetic pulses. Further details of various aspects of the invention are described hereafter.

Artificial Atoms and Molecules

Constrictions in a channel cause reflection of an incident particle but never confinement. Contrariwise, enlargements in a channel, such as a "bubble" or node (described with respect to FIG. 1 hereafter), can host a bound state lying below the continuum of scattering states. Thus, enlargements in a channel can trap a particle, while constrictions in a channel cannot trap a particle. Theories and theorems that are peculiar to one-dimensional physics are based on elimination of 2 of the 3 spatial dimensions. In practice this could be achieved by guiding the particle through narrow channels, as in a waveguide. The transverse energies are $O(n_{tr}/a)^2$, $n_{tr}=1, 2, 3, \ldots$, given transverse dimensions $O(a)$. If the length of the channel, L, greatly exceeds a, all low-lying excitations $\epsilon_L = O(n_L/L)^2$, with $n_L = \pm 1, \pm 2, \ldots$, would be of the longitudinal type. In the large L limit, these form a gapless quasi-continuum rising from the lowest energy of the particle (at $n_{tr}=1$), which is denoted herein as $\epsilon_\Box$ and that constitutes the basic unit of energy for our model. It is: $\epsilon_\Box = \hbar^2/2m^*(\pi^2/a^2)$, with $m^*$=effective mass of an electron in the channels. This result from solving the Schrodinger equation is also compatible with the uncertainty principle.

It has long been thought that the narrower the channel, the more the motion is one-dimensional. This cannot be entirely accurate. According to the Schrodinger equation, which determines the dynamics of quantum particles such as electrons, etc., it is precisely because a longitudinally moving particle carries with it a minimum transverse energy $\epsilon_\Box$ that it can be trapped in regions of rapidly changing geometry, i.e., reduced to zero dimensions. It is useful to think of $\epsilon_\square$ as a reservoir of energy that, when tapped by purely geometrical structures, can localize a particle.

The present invention deals with geometry. The practical advantages that this provides include: to localize a particle there is no need to alter the chemistry or atomic structure within the confining region, as only the size and shape of the confining region need be varied, making the methods of the invention ideally suited to photo-lithographic techniques. The root physical cause of the effects of the invention are anchored in elementary quantum wave mechanics, as illustrated by the following example and in the sections that follow, and also apply to other wave-like phenomena.

According to the uncertainty principle, if an electron has the choice of being located within a long strip L of width a, or within a bubble (i.e., circle) of sufficiently large radius b, it will, in the ground state, always select the bubble (the details are in Eq. (4) below). This is not due to a lowered potential that attracts the electron, as the potential energy is, by hypothesis, everywhere constant within the confined areas. Rather, it is that for sufficiently large b the kinetic energy in the bubble, $\epsilon_{bubb} \leq \hbar^2(2.405\ldots)^2/2m^*b^2$, is less than the minimum kinetic energy in the channel, $\epsilon_\square = \hbar^2\pi^2/2m^*a^2$. Therefore, in the ground state, the particle has to remain bound to the bubble even when the bubble is connected to the channels. In that case the ground state wave function is localized in and around the bubble, decaying exponentially into the channels. The length of this "tail" in units of a is inversely proportional to the square root of the binding energy $\epsilon_{BE}$. Thus, these "tails" can be "tailored" by manipulation of the binding energy $\epsilon_{be}$, which is a function of b/a only.

Figure 1:
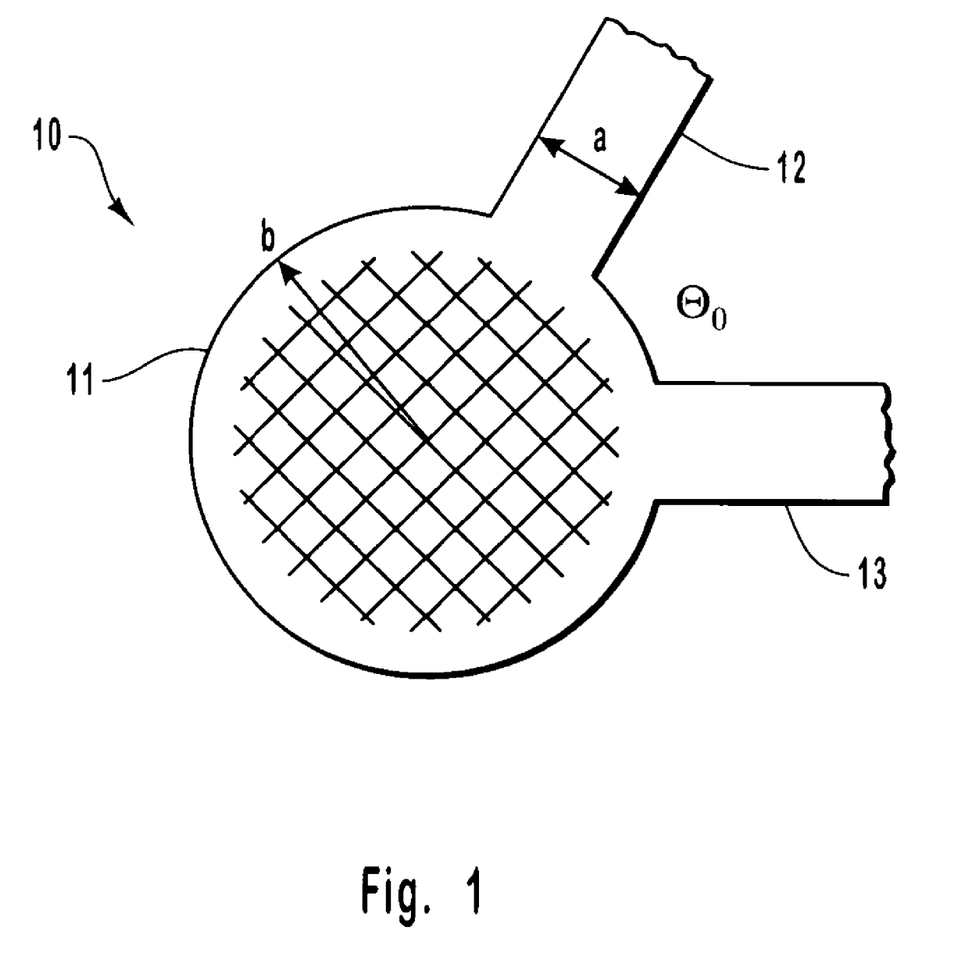
FIG. 1 is a schematic depiction of the geometry of an artificial atom of the present invention having a single circular node connected to a pair of channels, all of a constant depth or the circle may be replaced by a sphere of the same radius and the strips by cylindrical shapes of the same diameters and lengths.

One possible geometry for a structure of the present invention is illustrated in FIG. 1, which depicts a "bubble" structure 10 having a single circular node 11 of radius b (i.e., an artificial "atom") connected to a pair of channels 12 and 13 having width a and positioned at an angle $\theta_0$ with respect to each other. The radius of the circular node can be from about 1 nm to about 100 nm, and preferably from about ⅔ times the width of the channels to about twice the width of the channels. The channels can have a width from about 1 nm to about 100 nm as well, but preferably from about 5 nm to about 50 nm. The circular node 11 is configured to hold one or more particles (e.g., 1 or 2 particles) such as an electron, with the electron confined to the channels or the node. When the ratio b/a is sufficiently large, the ground state is well-localized at the node and has short tails (if the ratio is 1 or slightly less than 1, the length of the tails, l, become longer). The structure shown in FIG. 1 provides the building blocks for artificial molecules and arrays. The artificial atoms should be no less than 1 or 2 "tail lengths" apart or else their wave functions "fuse." The bandwidth in the artificial arrays, as well as the splitting of the bonding-antibonding orbitals in smaller "molecular" arrays, decreases exponentially with the inter-"atomic" separation L, approximately as $4\epsilon_{be}\exp\text{-}L/l$. In this geometry, the results are practically independent of the angle $\theta_0$. The binding energy is expressed as a fraction of the minimum transverse energy $\epsilon_\square$. Once this unit is factored out the model is without parameters. Unless 2 or more electrons and their Coulomb interaction are considered, there are no additional parameters and binding is a function of the geometry only.

In one embodiment of the present invention, an insulator substrate (e.g., but not limited to, sapphire, quartz, etc.) has channels or strips of an intrinsic semiconductor material with nodes (e.g., but not limited to, indium antimonide (InSb), silicon, gallium arsenide, indium phosphide, germanium) formed thereon. These channels and the nodes that decorate them are all at a constant potential $V(r)=-V_0$ relative to the insulator background. $V_0$ need only be sufficiently large (i.e., $V_0 > \epsilon_\square$) that it can be replaced by the condition that the wave function is $\Psi=0$ at the channel walls without significant error. Beyond this requirement, the magnitude of $V_0$ is irrelevant. However, the product $k_B T$ should always be low compared with $\epsilon_{BE}$, the energy required to ionize the artificial atom. Thus, one design parameter is that $\epsilon_\square$ exceed 2 or 3 times the value of $k_B T$ at which the device is to be operated. By employing optimal physical parameters a and m*, it is possible to raise $\epsilon_\square$ up to about 1 eV, which corresponds to a temperature of 11,000 K, thus allowing devices incorporating the present invention to operate far above room temperature.

Once the chemical and physical composition of the insulating substratum, the semiconductor, and the gate and insulating barrier have been chosen, only the geometry of the nodes and channels needs to be adjusted. The practical advantages are many. There is little or no need to alter the chemistry or atomic structure within the entire confining region, either to trap a particle or to allow it to wander. Only the shapes and sizes in the geometry need be varied. This method is ideally-suited to photolithography or electron microscopy.

Figure 2A:
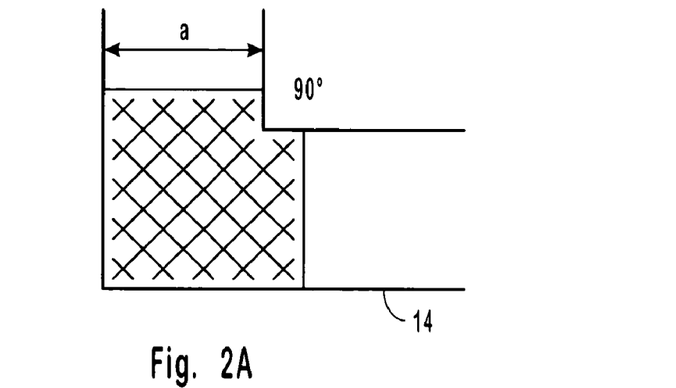
FIG. 2A is a schematic depiction of a right angle bend in a channel, also capable of localizing an electron at the bend.
Figure 2B:
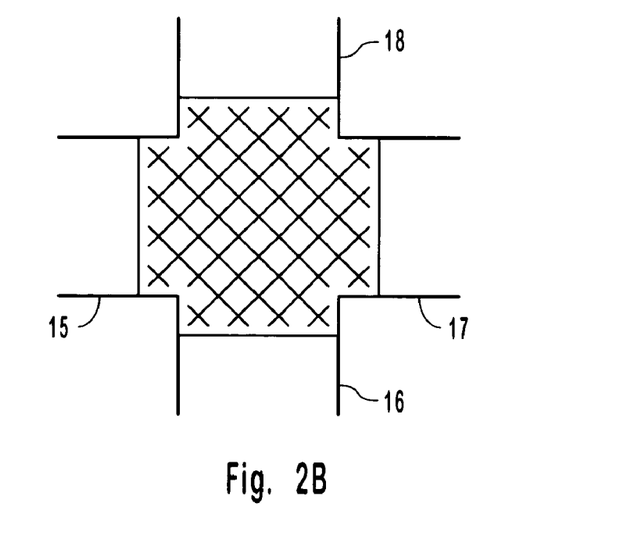
FIG. 2B is a schematic depiction of a right-angle intersection of four channels according to another embodiment of the invention, and it can be shown that when an electron is introduced into this geometry, it preferentially becomes localized at or near the node.
Figure 2C:
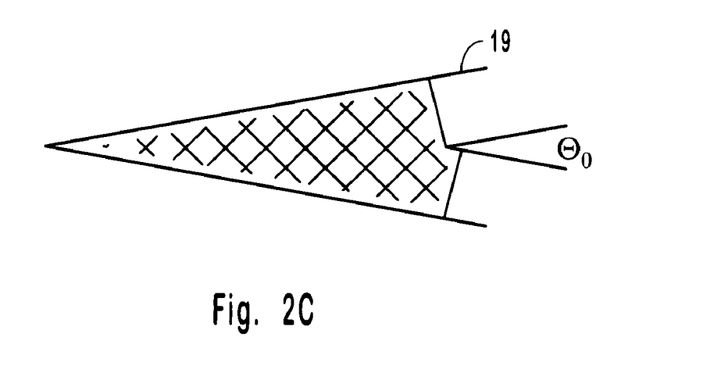
FIG. 2C is a schematic depiction of a channel with a sharp bend according to a further embodiment of the invention, also capable of localizing an electron at the bend.

It should be understood that even just a bend or connection in a channel or channels can act as a node or reservoir for a particle, and that a physical circular structure is not necessary to achieve the effects of particle binding described herein. For example, FIGS. 2A–2C show various channel bends or connections. FIG. 2A depicts a right angle (90°) bend in a channel 14, which has a small but finite binding energy at the corner. FIG. 2B shows a right-angle intersection of four channels 15, 16, 17, and 18, while FIG. 2C shows a channel 19 with a sharp acute angle bend (e.g., $\theta_0 < 45°$), with a binding energy ¾ times the unit.

Consider a single electron inserted into a channel of indefinite length that, at some point, is bent by some angle. Rather than solving the Schrödinger equation outright, the initial approach is variational. Using a simple trial function adapted to the symmetry of the bend it is found that, at some sufficiently acute angles, the optimum variational energy $\epsilon_0$ lies lower than $\epsilon_\square$. In that case, the wave function is anchored at the singularity and decays exponentially into the channel with a characteristic tunneling length $$l = \sqrt{\frac{\hbar^2}{2m(\epsilon_\square - \epsilon_0)}} = \sqrt{\frac{\hbar^2}{2m\epsilon_{BE}}}.$$

Because the variational solution is not exact, the true ground state has energy even lower than the calculated $\epsilon_0$, hence a value of l that is even shorter than what is calculated. In the example of a square corner (90° bend) shown in FIG. 2A, the quantity l=1.6a. It is also estimated that a substantial fraction, approximately ⅓ of the total probability, is localized in the corner. Other aspects of the localized and scattering states of the electron are covered in the paper by Goldstone and Jaffe previously referenced and appended.

The Binding Energy

The variational solution given below applies to the 90° channel bend illustrated in FIG. 2A. In the corner region we assume a trial function $\Psi_I(x,y)=\sin(\pi xy/a^2)$ while in the horizontal channel we take $\Psi_{II}=\sin(\pi y/a)\exp(-q(x-a))$, and similarly the vertical channel, upon exchange of x⇄y. For the 3$^{rd}$ dimension we take a constant depth z, thereby increasing the ground-state energy by a minimum constant amount $$\varepsilon_z = \frac{\hbar^2 \pi^2}{2m*z^2}.$$

But until we also vary the depth of the channel and/or that of the bend (kinks), $\epsilon_z$ remains an ignorable constant of the motion. With this simplification the theory is effectively restricted to 2 spatial dimensions and all energies given are relative to $\epsilon_z$. Similar results apply when the bend is in a cylindrical tube and need not be repeated here.

Although $\Psi_I$ and $\Psi_{II}$ are continuous at x=a, their derivatives are not. Thus the total kinetic energy must take into account the discontinuity in the normal derivatives $\Psi$ that occur at x=a and at y=a. The exact two-dimensional ground-state energy co is bounded from above as follows:

$$\varepsilon_0 \leq \frac{\hbar^2 \pi^2}{2m*a^2} \times \text{Numerator/Denominator}, \tag{1}$$

where Numerator=$N_1+N_2+N_3$ and Denominator=$D_1+D_2$. These quantities are, respectively, $$N_1 = \pi^2 \int_0^1 dx \int_0^1 dy (x^2+y^2)\sin^2(\pi xy) = \frac{\pi^2}{3} + \frac{1}{4}$$

$$N_2 = 2(\pi^2 - (qa)^2) \int_0^1 dy \sin^2 \pi y \int_1^\infty dx e^{-2qa(x-1)} = \frac{(\pi^2 - (qa)^2)}{2qa},$$

and $$N_3 = -2 \int_0^1 dy \sin \pi y (-qa \sin \pi y - \pi y \cos \pi y) = qa - \frac{1}{2}. \tag{2A}$$

Also, $D_1 = \int_0^1 dx \int_0^1 dy \sin^2 \pi xy = \frac{1}{2} - \frac{1}{4\pi} \int_0^1 dx \frac{\sin 2\pi x}{x}$ and $$D_2 = 2\int_0^1 dy \sin^2 \pi y \int_1^\infty dx e^{-2qa(x-1)} = \frac{1}{2qa} \tag{2B}$$

The integral that appears in $D_1$ is the only one that could not be performed in closed form. It was evaluated using Mathematica. We then obtain for the ratio $\epsilon_0/\epsilon_\square \equiv r(qa)$:

$$r = \frac{1 + qa\left(\frac{2}{3} - \frac{1}{2\pi^2}\right) + (qa/\pi)^2}{1 + qa(0.774294 \ldots)} \tag{3}$$

The optimal value of this expression is at qa=0.628293 . . . , hence l=1.6a. This yields r=0.96000 and in turn, a small but nonvanishing variational binding energy $\epsilon_{BE}$=0.04$\epsilon_\square$. From the denominator in (3) one infers that a fraction 0.628× 0.774/(1+0.628×0.774)≈0.33 of the electron's probability function ($|\Psi|^2$) is localized in the square a×a region. Hence a fraction 0.33 is localized in each of the two adjacent channels within a distance of the order of l=1.6a from the borders of the square. A similar calculation can be performed for the geometry of the right-angle intersection of four channels shown in FIG. 2B.

The fact that a single 90° bend traps the electron is surprising, but it has also been found that a 60° bend binds better than 90° and, in general, that the binding energy increases rapidly as the angle $\theta_0$ in the structure of FIG. 2C becomes more acute. In the limit of a sharp tip (i.e., for $\theta_0$<45°), the ground state energy $\epsilon_0 \to \frac{1}{4}$× the unit (independent of $\theta_0$) and $\epsilon_{BE}$ tends to a robust limiting value, 0.75 $\epsilon_\square$. (This too is an exact result.) Nevertheless, it is believed that the circular nodes of the structure of FIG. 1 are superior to sharp bends, and their fabrication should also be easier. The binding of the circular nodes is always substantial and practically independent of the angle $\theta_0$ between incoming and outgoing channels, even at b=a. At given b the binding energy exceeds the following formula: $\epsilon_{BE} \geq \hbar^2/2m*(\pi^2/a^2 - (2.405 \ldots)^2/b^2) \to 100\% \epsilon_\square$ at large b.

For channels from about 1 to about 10 nm in width and m≈free electron mass, the unit $\epsilon_\square$ is about 30 meV to about 0.3 meV. In many semiconductors the effective mass m* is <<m; then the unit is increased by an additional factor m/m*, a ratio that ranges from about 10 to about 100 depending on the semiconductor. Judicious choices of a and m* allows "tuning" $\epsilon_\square$ from a fraction of an meV, appropriate to liquid He temperatures, up to O(1 eV), and up to a theoretical maximum of 40 times room temperature as expressed in meV (note—room temperature→approximately 25 meV). While small values of a and m* might be most desirable for practical applications, broader channels have the advantage of lower noise and greater ease of manufacture.

It is known by those skilled in the art how to grow channels of $SiO_2$ or $TiO_2$ of various widths in the range of about 0.5 run to about 20 nm, using atomic force microscopy (AFM). Atomic Force Microscopy allows for the deposition of atoms and molecules on a surface, one atom at a time to create clusters of various shapes having a dimension of about 1 nm or less. Present-day technology is increasingly capable of improving on these parameters; for example, see the paper by H. Yu et al, *Two-versus Three-Dimensional Quantum Confinement in Indium-Phosphide Wires and Dots*, Nature Materials vol. 2, 517 (2003), which is incorporated herein by reference. Lithography or other techniques should ultimately allow industrialization of the structures and devices of the present invention.

Artificial Molecules

Figure 3A:
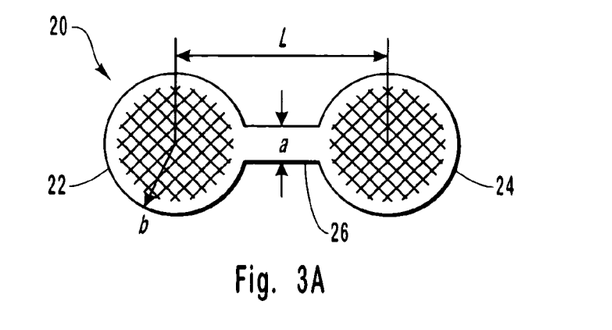
FIG. 3A is a schematic depiction of an artificial molecule with a dumbbell configuration according to an embodiment of the invention.
Figure 3B:
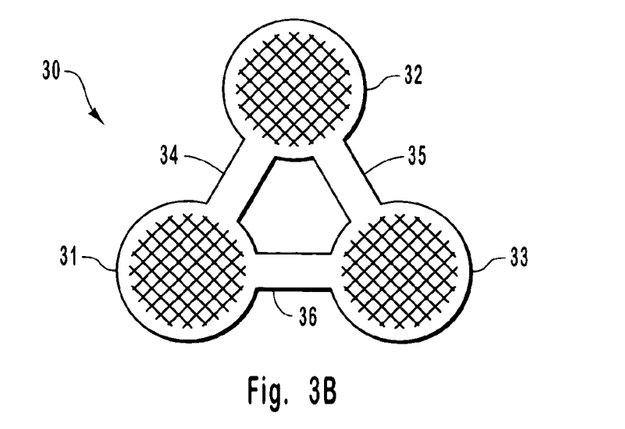
FIG. 3B is a schematic depiction of an artificial molecule with a triangle configuration according to another embodiment of the invention.
Figure 3C:
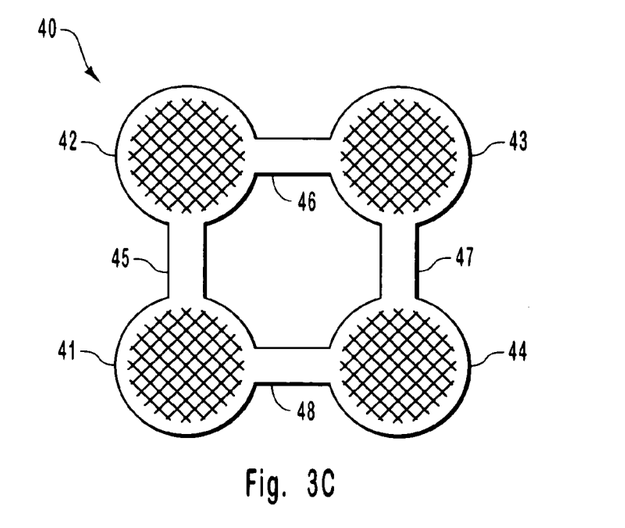
FIG. 3C is a schematic depiction of an artificial molecule with a square configuration according to a further embodiment of the invention.

Nonlimiting examples of small artificial molecules that use the bubble structure of FIG. 1 in various lattice configurations are shown in FIGS. 3A–3C. In the "dumbbell" structure 20 of length L illustrated in FIG. 3A, an electron can reside in either or both of two circular nodes 22 and 24, which are communicatively connected by a channel 26 having a width a. The dumbbell structure 20 represents artificial $H_2$, and each node has a radius b. FIG. 3B shows a "triangle" structure 30 having three nodes 31–33 interconnected by three channels 34–36. FIG. 3C depicts a "square" structure 40 having four nodes 41–44 interconnected by four channels 45–48.

Figure 4:
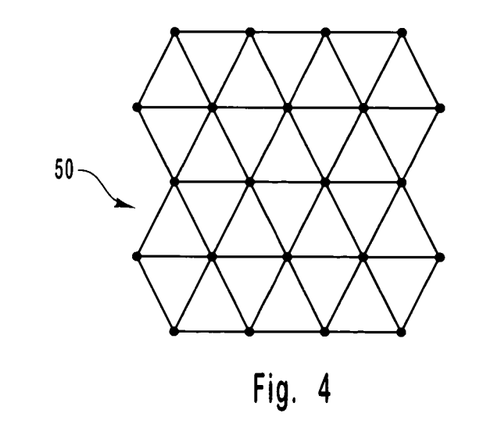
FIG. 4 is a schematic depiction of a triangular lattice molecular grid, such as an array that is formed with a plurality of base triangle structures as depicted in FIG. 3B.
Figure 5:
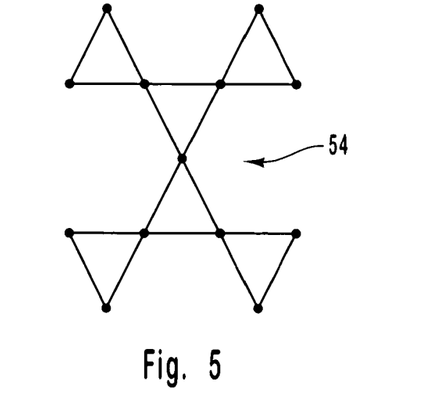
FIG. 5 is a schematic depiction of a kagome lattice molecular grid or array that is formed with a plurality of base triangle structures such as depicted in FIG. 3B.
Figure 6:
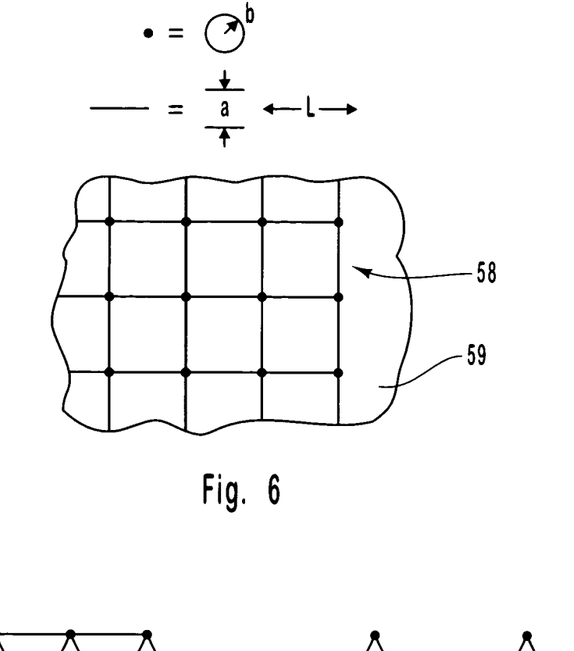
FIG. 6 is a schematic depiction of a square lattice molecular grid that is formed with a plurality of base square structures such as depicted in FIG. 3C.
Figure 7:
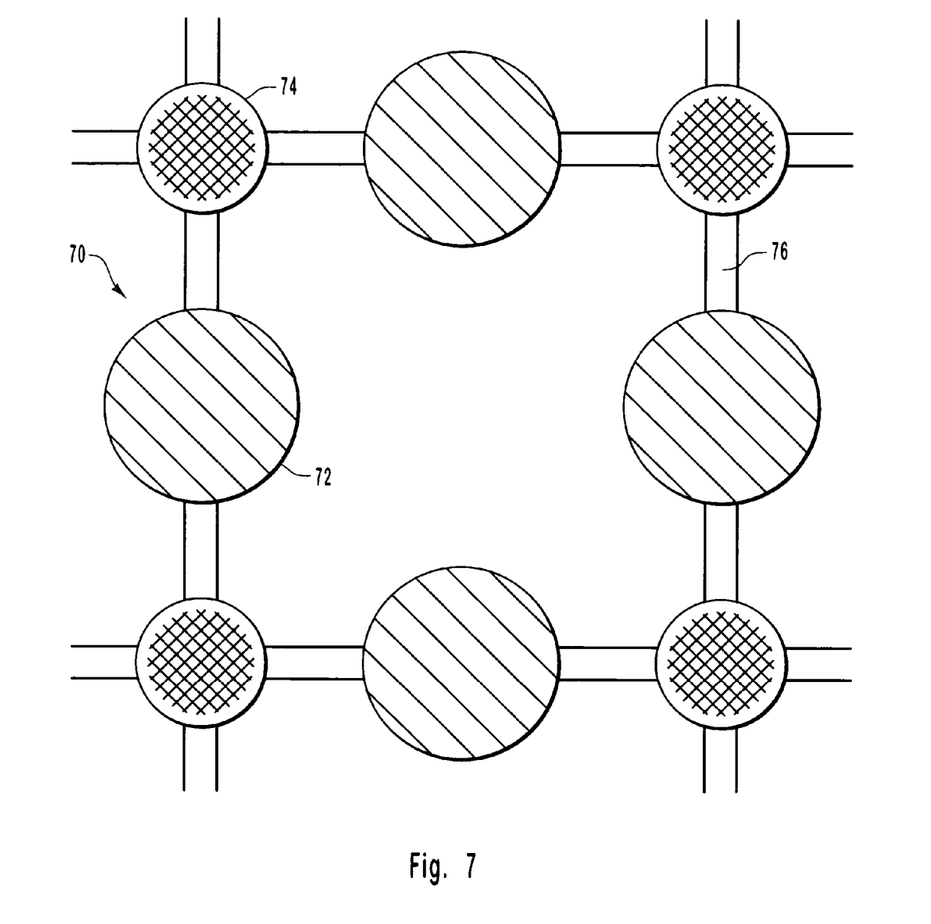
FIG. 7 is a schematic depiction of one square of a "decorated" square lattice molecular grid that is formed with a plurality of base "decorated" squares.

Various molecular grid configurations can be formed by adding additional nodes and channels to produce a variety of molecular arrays of indefinite size that can be viewed as larger artificial molecules. For example, a triangular lattice 50 is shown in FIG. 4, and a kagome lattice 54 is shown in FIG. 5, both of which use a plurality of base triangle structures like that depicted in FIG. 3B. A square lattice 58 is shown in FIG. 6, which uses a plurality of base square structures like that depicted in FIG. 3C. In addition, hexagonal and other lattices are also possible, such as quasicrystals (tiled by pentagons). In fact, all two-dimensional lattices can be artificially constructed out of the artificial atoms and molecules of the present invention. The decorated square lattice of FIG. 7 is of particular importance. The simplest large arrays or grid configurations (although not that of FIG. 7) can be formed by laying down strips of intersecting semiconductor material over an insulating substrate, such as substrate 59 shown in FIG. 6, with a kink or node formed where the ribbons cross, allowing the formation of a bound state.

The "hopping" energy $2t^*$ is defined as the splitting between symmetric ("bonding") and antisymmetric ("antibonding") orbitals. $\Psi_{sym}$ has a finite "tail" $\propto \exp-L/2\lambda$), halfway down the channel. $\Psi_{antisym}$ vanishes halfway down the channel. The splitting is typically of the order of $t^*=8\epsilon_{BE}\exp-L/\lambda$. This value is then used in the 2-site "hopping" Hamiltonian, $H_{hop}=-t^*(c_1{}^+c_2+H.C.)$. Recalling $\epsilon^{BE}\propto(1/\lambda)^2$ we maximize $t^*$ w.r. to $\lambda$, obtaining $\lambda\approx L/2$. This in turn determines an optimal aspect ratio L/a such that $2\lambda<L<4\lambda$. If L is much longer than $4\lambda$, $t^*$ will become exponentially small relative to the other parameters in the model. If L is shorter than $2\lambda$, the localization is lost. In what follows, it is assumed that $t^*$ is optimized and the nearest-neighbor distances are all L. There may, however, be good reasons to engineer a smaller value of $t^*$ in localized regions where particle itinerancy is undesirable.

The interaction of 2 electrons provides a second parameter, U. If both particles are present at the same node, the Coulomb repulsion is $\approx O(e^2/2b)$. In the present units this is:

$$\frac{e^2 2a^2 m^*}{2b(\hbar\pi)^2} = \left(\frac{1}{\pi^2}\right)\left(\frac{a}{b}\right)\left(\frac{a}{a_{Bohr}}\right)\left(\frac{m^*}{m}\right),$$

where $a_{Bohr}\approx 0.529$ Å. Being neither obviously negligible nor obviously dominant, the Coulomb term is an independent, variable, parameter that is sensitively dependent on the size-scale parameter a. The relevant Hamiltonian is $H_{Coul}=U(n_{1\uparrow}n_{1\downarrow}+n_{2\uparrow}n_{2\downarrow})$, where $n_{j,\uparrow}=c_{j,\uparrow}{}^+c_{j,\uparrow}$. Because U>0, the two electrons will reside preferentially on distinct nodes.

In the ground state the spins should also demonstrate a tendency to be antiparallel. This is measured by an "exchange parameter" J. With an electron at each end of the dumbbell 20, the bound states include 1 singlet ground state and a triplet of excited states. The singlet-triplet splitting is $$J = \sqrt{\left(\frac{U}{2}\right)^2 + (2t^*)^2} - \frac{U}{2},$$

so that $0<J<2t^*$. J appears only in the spin-spin interaction, $H_{sp-sp}=J(S_1 \cdot S_2 - \frac{1}{4})$, with $$S_1 = \frac{\hbar}{2}[c_{1\uparrow}^+, c_{1\downarrow}^+][\vec{\sigma}]\begin{bmatrix}c_{1\uparrow}\\c_{1\downarrow}\end{bmatrix},$$

etc. It has the appearance of a 2-body attractive force favoring singlets. It should be emphasized that the calculation of J did not invoke any new physical mechanism and that it is not an independent parameter, just a useful one.

Combining terms, with $H=H_{hop}+H_{Coul}+H_{sp-sp}$ for an arbitrary geometric array of nodes connected by channels, we find the array to be governed by one or another modification of the Hubbard or (if we include J explicitly,) the t-J models, both frequently studied and invoked in connection with high-Tc superconductivity. One notes a subtle difference, in that a spectrum of delocalized channel states exists here, not very much higher in energy than the family of localized states that encompass the Hilbert spaces of the Hubbard-t-J models. However, on decorated square lattices such as that of FIG. 7, the singlet states on the artificial oxygen atoms (the "decoration" bubbles on the links) are able to impose their singlet nature onto Cooper pairs in a manner that cannot be described by the simpler and less structured Hubbard or t-J models.

Three electrons at the corners of a triangle structure such as shown in FIG. 3B have total spin ½ in the ground state and 3/2 in the excited states. Such triangle structures are naturally "frustrated."

Four electrons localized at the corners of a square structure such as shown in FIG. 3C have total spin zero in the ground state and spin 1 in the lowest-lying excited bound-state configurations. Three electrons in this molecule can have a level crossing from a ground state doublet configuration (minimal spin) to a ground state quartet (maximal spin) at a certain value of U, dependent on the scalar dimensions of the bubbles and their connections. This unusual feature is discussed in detail in D. C. Mattis, *Eigenvalues and Magnetism of Electrons on an Artificial Molecule*, Int. Journal of Nanotechnology 2, 165 (2003), which is incorporated herein by reference.

In studying eigenstates of arrays containing fewer than 1 electron per node, both the "hopping" matrix element $t^*$ that allows a localized particle to move to a neighboring unoccupied node and the antiferromagnetic coupling constant J that couples the spins of two neighboring electrons are of primary importance. Moreover, $t^*$ and J are both of the same order of magnitude, subject to the inequality noted earlier, $0<J<2t^*$. Interesting quantum states can be created artificially by changing the number of electrons away from the "critical" number of 1 per node. For example, the ground state of a triangle structure containing only two electrons is split to $O(t^*)$ into 3 singlet states, corresponding to the 3 distinct values of the angular momentum of the missing electron or "hole."

Antiferromagnetic, Metallic and Superconducting Networks

By connecting individual units of the types shown in FIG. 3A–3C, various geometrical grid arrays or "networks" can be created. For an artificial s=½ antiferromagnet, there must be one electron per bubble (i.e., node or vertex) on the given grid. This can be accomplished by chemical doping of the substratum (e.g., by locating "donor" atoms within the substratum, or depositing a n-doped semiconductor layer above the active network), in conjunction with a metallic gate communicating with the network via a high-resistance layer, as in a MOSFET, to send electrons into the channel. The latter could "fine tune" the former by the capacitance effect.

By such structures, an artificial Hubbard or t-J model on an artificial lattice with adjustable occupation numbers can be constructed. This can be done in one dimension (1D), i.e., on a linear array of bubble nodes of radius b separated by channels of length L and width a containing a variable number of electrons. At partial filling, well-known aspects of the 1D metals can be tested, such as separation of spin and charge, etc. At half-filling, the spin one-half one-dimensional Heisenberg model can be recovered and its well-known properties observed.

With regard to two-dimensional (2D) arrays, since the discovery of Tc>30 K superconductivity in LaCuO, numerous other high-Tc superconductors of the $CuO_2$-based perovskite family have been constructed. The highest Tc's are presently just shy of 200 K. Aside from a shared crystal structure, the key elements they all have in common are stacks of square (sq) antiferromagnetic arrays, weakly-coupled along the c-axis. Once a sufficient concentration of holes is introduced by alloying, some of these materials trade their antiferromagnetism for high-Tc superconductivity (HTS). Over the past decade and a half there have been innumerable attempts to evaluate the correlations in the 2D Hubbard model, to search for the microscopic sources of HTS. The decorated square lattice of FIG. 7 is an artificially constructed, or "analog", version of the electronics in a copper-oxide layer and does not require any further approximations or modeling to exhibit properties that are presumably quite similar to the latter.

Additionally, there is an intriguing possibility that the triangular or kagomé lattices, whether those of the Figures or "decorated" versions thereof, make even better superconductors. When the occupation number is 1, these are fully frustrated two-dimensional antiferromagnets, hence highly paramagnetic. But they too might be unstable against superconductivity when the density of electrons is fractionally lower than the density of nodes. Because $CuO_2$ is not known to occur either naturally or artificially in planar triangular or kagomé lattices, there is no experimental precedent. Nevertheless, the construction of such "geometrically frustrated lattices" of geometrically localized states does not pose any additional difficulties.

A particularly useful application is the decorated square lattice 70 in FIG. 7, with the "decoration" spheres 72 (the artificial oxygen atoms) larger than the corner spheres 74 on the vertices (the artificial copper atoms), such that spheres 72 accommodate 2 electrons each while the corner spheres 74 can only accommodate 1 electron each. The spheres 74 have a radius $b_1$ and the spheres 72 have a radius $b_2$. The channels 76 between the spheres have a radius $a \approx \frac{2}{3} b_1$ and length l of approximately $b_2$. The sizes and connections have to be such that when the electron number is reduced below 5 per cell, the electrons have been primarily removed from the artificial oxygen atoms and not from the artificial copper atoms, just as is believed to be the case in $CuO_2$ on which this is modeled. To the extent that the artificial atom model emulates the chemistry of $CuO_2$ planes, one should observe a dramatic change in the resistivity—by many orders of magnitude—when the electron concentration is changed from 5 per cell to a little more than 4.

The following shows one possible application of the superconducting phase. It is assumed that through substratum doping, or by tunneling, a fraction of the requisite numbers of electrons are introduced into an artificial network such as we have described. Given the dimensions suggested above, the electron density that is required is low, estimated at typically less than $O(10^{12}/cm^2)$, i.e., of the order of the density of nodes formed on the surface. Most of the surface consists of the substratum insulator, with only a fraction of it occupied by the active network.

Part of the required number of electrons can be supplied via substratum doping as described in paragraph [051] herein, but that is a fixed number. By superposing capacitative charging via tunneling, one can further affect the density of electrons, reducing or increasing their number substantially from what was built-in. Now, the value of $T_c$ depends on electron density. At densities where the active network transitions rapidly from insulator (at 1 electron/bubble) to a metal or even superconductor (i.e., at 20% fewer electrons), a small change in the gate voltage can take the network from an insulating or poorly conducting phase to a highly conducting or even superconducting phase, depending on the temperature. In that case, the sheet resistance of the artificial lattice would change by several orders of magnitude. This enormous leverage could be used to create a novel metal insulator superconducting field effect transistor, denoted herein: "MISFET."

Artificial Atoms and Molecules as Memory Elements

The present invention allows the creation of nano-logical elements for low-loss information storage and retrieval. Both the position of an electron at a node and the direction of its spin may be viewed as parameters to be recorded and detected. For example, a triangle structure carrying three electrons with total spin ½ has 2 sets of degenerate ground state doublets of $$\text{energy} - \frac{3}{4} J,$$

plus 4 excited states of total spin 3/2 having $$\text{energy} + \frac{3}{4} J.$$

As the two sets don't normally mix, the higher-energy spin configurations are metastable. The spin of the triangle could be "read" non-destructively. What is more, low-spin can be transformed into high spin ("rewritten,") or vice-versa, by the action of a weak a-c field of frequency $$\omega = \frac{3J}{2\hbar}$$

or by the passage of a small magnetic pulse. Static magnetic fields partially lift the degeneracies: the ground states will split into two sets by an amount proportional to the external field B, the excited states into 4 distinct sets by an amount 3 times as great. Crystal anisotropy may further split the states.

In the artificial molecules shown in FIGS. 3A–3C, t* and J can be varied at will by changing the aspect ratio L/a. An external magnetic field B splits the magnetically degenerate states. As these quantities are all adjustable variables, their magnitudes are not specified herein. Thus, assuming 1 electron/node, the ground states of the structures of FIGS. 3A and 3C are unaffected by B while the lowest excited state of each moves down by −B. If B exceeds J, the ground state and first excited state switch identity.

Another example is that previously cited, of 3 electrons on the artificial square molecule. If the dimensions are properly chosen such that U is close to, but just below $U_c$, a small magnetic field can promote the spin 3/2 state of maximum magnetization, at the expense of the usual doublet ground state of spin ½ or minimum magnetization.

In any case, a small electromagnetic pulse can probe where the molecule is in its ground state or first excited state, and depending on its length, can also rewrite the state. The eigenstates persist indefinitely until perturbed. This allows the artificial atoms and molecules to be used as memory elements.

For the triangle structure, the ground state doublet and the excited state quartet play the same roles as the singlet and triplet states above. The important point, once again, is: eigenstates are stationary, i.e., they persist indefinitely unless perturbed and cost no energy to maintain.

The present invention has the benefits of providing for the potential of making artificial antiferromagnets, memory elements, and high-temperature superconductors out of channeled electrons in two dimensions, entirely without benefit of magnetic ions, using only existing technology. In addition, the invention can be applied to bosons (e.g., photons, phonons, excitons), in that the sole requirement to localize bosons is that the "cavity" at a node (i.e., the intersection of 2 or more channels) is able to support a normal mode of frequency lower than the bottom of the pass-band of the waveguides (channels) to which the node connects.

In addition, the artificial networks of the invention have an electrical resistivity that depends on the concentration of electrons. Near 1 electron/node, an antiferromagnetic insulator is created. With a lower number of electrons, a metallic or superconducting conductivity (low resistance in either case) is produced. A metallic gate that injects electrons into the network (through an insulating layer) sees a high impedance. A small change in voltage results in a large change in resistivity of the network plane. Thus, a power amplifier or transistor is produced.

In another aspect of the invention, cylindrical channels such as nanotubes can be used in three-dimensional embodiments, such as fully 3-dimensional networks. Nanotubes are typically carbon cylinders having a diameter of a few nm and a length of about 10 nm. Nanotubes can be used as a channel for electromagnetic waves, electrons, and other subatomic particles. The nodes can be formed from bucky balls, or spherical arrays of carbon atoms. The materials would all be homogeneous, with only the geometry being manipulated. Electrons can be inserted by depositing a selected number of hydrogen atoms into the nodes. Photons would be introduced via electromagnetic radiation and would be similarly localized, although there is no interaction term among them corresponding to the Coulomb interaction U of the electrons.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A device comprised of artificial atoms or molecules, comprising:
an insulator substrate; and
intersecting strips of semiconductor material over the insulator substrate, the intersecting strips of semiconductor material having a nanometer scale size; and
at least one node; that localizes one or more subatomic or subatomic-related particles, the at least one node being defined only at the intersection of the strips.

2. The device of claim 1, wherein the substrate comprises sapphire or quartz.

3. The device of claim 1, wherein the strips of semiconductor material are selected from the group consisting of indium antimonide, gallium arsenide, indium phosphide, germanium, and silicon.

4. The device of claim 1, wherein the strips of semiconductor material comprise a first channel having a width of about 1 nm to about 100 nm.

5. The device of claim 4, wherein the node comprises a circular or spherical node.

6. The device of claim 5, wherein the node has a radius from about 1 nm to about 100 nm.

7. The device of claim 5, wherein the node has a second strip of semiconductor material attached thereto.

8. The device of claim 7, wherein the second strip of semiconductor material comprises a second channel having substantially the same width as the first channel.

9. The device of claim 7, wherein the second strip of semiconductor material comprises a second channel having a width of about 1 nm to about 100 nm.

10. The device of claim 1, wherein the strips of semiconductor material further comprise a right-angle intersection of four channels at the node.

11. The device of claim 1, wherein the subatomic or subatomic-related particles are selected from the group consisting of electrons, photons, excitons, and phonons.

12. An artificial molecule, comprising:
an insulator substrate;
a first channel of semiconductor material on the insulator substrate;
a first circular node on the channel; and
a second circular node on the channel and spaced apart from the first circular node;
wherein the first and second nodes are configured to hold from about 1 to about 2 subatomic particles, with the particles being confined to the nodes, and wherein the first and second circular nodes are respectively defined only at intersections of the first channel with a second channel and a third channel of semiconductor material on the insulator substrate.

13. The artificial molecule of claim 12, wherein the second channel of semiconductor material extends from the first circular node, and wherein the third channel of semiconductor material extends from the second node.

14. The artificial molecule of claim 13, further comprising a third node connected to the second channel and the third channel to form a triangular structure.

15. The artificial molecule of claim 13, further comprising a third node connected to the second channel, a fourth node connected to the third channel, and a fourth channel connected to the third and fourth nodes.

16. An artificial molecular array, comprising:
an insulator substrate;
a plurality of interconnected channels on the insulator substrate, the channels having a nanometer scale size; and
a plurality of nodes that are each defined only at points of interconnection of the channels;
wherein each of the nodes holds from about 1 to about 2 subatomic or subatomic-related particles, with the particles being confined to the channels or the nodes.

17. The artificial molecular array of claim 16, wherein the plurality of interconnected channels and nodes comprise at least one of a triangular lattice, kagome lattice, square lattice, or decorated lattice.

18. The artificial molecular array of claim 16, wherein the plurality of interconnected channels and nodes form an artificial network.

19. The artificial molecular array of claim 18, wherein the artificial network comprises an artificial electrical conductor, with sheet resistance controlled by an external capacitative gate.

20. The artificial molecular array of claim 18, wherein the artificial network comprises a field effect transistor.

21. The artificial molecular array of claim 18, wherein the artificial network comprises an antiferromagnet.

22. The artificial molecular array of claim 18, wherein the artificial network comprises a signal amplifier or a power amplifier.

23. A nano-logical memory element for low-loss information storage and retrieval, comprising:
   an insulator substrate; and
   channels of semiconductor material on the insulator substrate that intersect one another at substantially right angles; and
   a plurality of nodes each defined only at the intersections of the channels, wherein each node holds from about 1 to about 2 subatomic or subatomic-related particles, with the particles being confined to the node.

24. A method of forming an artificial atom or molecule, comprising:
   providing an insulator substrate; and
   depositing strips of semiconductor material on the insulator substrate that intersect one another at substantially right angles such that a plurality of nodes are each defined at only the intersections of the strips, the intersecting strips of semiconductor material having a nanometer scale size.

\* \* \* \* \*

UNITED STATES PATENT AND TRADEMARK OFFICE
CERTIFICATE OF CORRECTION

PATENT NO. : 7,045,811 B2
APPLICATION NO. : 10/737178
DATED : May 16, 2006
INVENTOR(S) : Mattis It is certified that error appears in the above-identified patent and that said Letters Patent is hereby corrected as shown below:

Title Page
Item 74, Attorney, Agent, or Firm, change "Workman-Nydegger" to --Workman Nydegger--

Column 1
Line 47, change "to-date" to --to date--

Column 3
Line 60, change "B45, 14, 100" to --B45, 24, 100-107--

Column 8
Line 31, change "run" to --nm--
Line 38, change "Indium-Phosphide" to --Indium Phosphide--

Column 9
Line 12, after "exp-L/2λ" remove ")"
Line 16, change "$c_1^+c_2+H.C.$" to --$c_1+c_2+H.C.$--

Column 10
Line 28, change "Nanotechnology" to --Nanoscience--

Signed and Sealed this

Third Day of July, 2007

JON W. DUDAS
*Director of the United States Patent and Trademark Office*